United States Patent [19]

Murray et al.

[11] Patent Number: 5,024,962

[45] Date of Patent: Jun. 18, 1991

[54] METHOD FOR PREVENTING AUTO-DOPING IN THE FABRICATION OF METAL GATE CMOS DEVICES

[75] Inventors: Roger W. Murray, Palo Alto; Nevand Godhwani, Sunnyvale, both of Calif.

[73] Assignee: Teledyne Industries, Inc., Mountain View, Calif.

[21] Appl. No.: 511,647

[22] Filed: Apr. 20, 1990

[51] Int. Cl.[5] .......................................... H01L 21/336
[52] U.S. Cl. ......................................... 437/40; 437/57; 437/41; 437/239; 437/942; 148/DIG. 4
[58] Field of Search ................. 437/239, 40, 942, 41, 437/43, 235; 148/DIG. 4; 357/23.6, 23.4

[56] References Cited

U.S. PATENT DOCUMENTS

| | | | |
|---|---|---|---|
| 4,584,205 | 4/1986 | Chen et al. | 437/239 |
| 4,729,009 | 3/1988 | Ang | 357/23.4 |

FOREIGN PATENT DOCUMENTS 0088328  4/1987  Japan ................................. 437/942

OTHER PUBLICATIONS

IEEE Electron Device Letters, vol. 6, No. 5, May 1985, pp. 205-207, J. Nulman et al., "Rapid Thermal Processing of Thin Gate Dielectrics Oxidation of Silicon".

*Primary Examiner*—Brian E. Hearn
*Assistant Examiner*—Kevin M. Picardat
*Attorney, Agent, or Firm*—Fliesler, Dubb, Meyer & Lovejoy

[57] ABSTRACT

A method of fabricating metal gate field effect transistors utilizing a rapid thermal oxidation process to form a sealing oxide which prevents auto-doping during the formation of the gate oxide.

8 Claims, 2 Drawing Sheets

METHOD FOR PREVENTING AUTO-DOPING IN THE FABRICATION OF METAL GATE CMOS DEVICES

BACKGROUND OF THE INVENTION

1. Field of the Invention

The present invention relates to the manufacturing of metal gate field effect transistors; more particularly to metal gate CMOS processing techniques.

2. Description of the Related Art

In conventional processes for fabricating metal gate MOS field effect transistors, the gate oxide is grown after the source and drain regions have been formed by implantation/diffusion for both the P-channel and N-channel devices. One result of this process sequence is that the source and drain regions are not self aligned with the gate. Another result is a problem known as auto-doping.

The acronym "MOS", which stands for metal-oxide-silicon, is generally used to refer to all field-effect transistors ("FETs"), including those fabricated with metal or polysilicon gates. As used herein the terms "metal gate FET", "metal gate field effect transistor", "metal gate CMOS FET", and similar terms refer to FETs having metal rather than polysilicon gates, and in which the gate oxide is formed prior to the formation of the metal gate.

The conventional process steps for fabricating metal gate CMOS field effect transistors in an N-type substrate are as follows. An initial oxide is grown on the surface of the substrate. The initial oxide is masked and etched to remove portions of the initial oxide where P-wells are to be implanted, and then P-type dopants are implanted and diffused to form the P-wells. The process of diffusing the P-wells grows a second oxide layer where the initial oxide was removed, and increases the thickness of the remaining portions of the initial oxide layer. Alternatively, the process may be performed for a P-type substrate having N-wells.

The initial oxide is then masked and etched to remove portions of the initial oxide where P-type source and drain regions are to be formed in the N-type substrate. The P-type dopant ions are introduced by implantation or vapor phase deposition, followed by a diffusion ("drive-in"). This drive-in simultaneously grows a new oxide layer in regions where the initial oxide layer was removed to allow the introduction of the P-type dopants into the substrate. The source and drain formation process is then repeated using N-type dopants to form source and drain regions in the P-wells.

After the P-type and N-type source and drain regions are formed the oxide layers are masked and etched to expose portions of the surface of the substrate corresponding to the channel regions defined between each source and drain pair. To insure that the gate oxide overlaps the source and drain regions, portions of the oxide layer overlying the portions of the source and drain regions adjacent to the channel are also removed. The gate oxide is then formed by oxidizing the substrate. After the gate oxide is grown, the oxide layers are masked and etched to open contact windows, a metal layer is deposited by sputtering, and then the metal layer is masked and etched.

Metal gate CMOS FETs fabricated using the above-described process tend to have undesirably large variations in the threshold voltages. A prime reason for variations in the threshold voltages is a phenomenon known as "auto-doping". Auto-doping is caused, in large part, by the introduction of N-type dopants into the channel regions during the oxidation process used to form the gate oxide. In particular, the heating of the wafers in the furnace used for the gate oxidation process causes diffusion of N-type dopants form the N-type source and drain regions and from the back surface of the wafer, which has an N-type background doping. In addition, the quartz furnace tubes used for the oxidation process become coated with phosphorus glass and act as a secondary source of N-type dopant ions. There may also be a transfer of P-type dopants (particularly Boron) at a less significant level.

The undesired auto-doping of the substrate under the gate oxide by with N-type dopants results in a shift of the threshold voltage in both the N-channel and P-channel FETs in a CMOS semiconductor device. The threshold voltage is a key parameter in FET operation, and thus shifts in the threshold voltage caused by auto-doping can create large differences in device performance. Further, the amount of auto-doping which occurs is related to the particular process utilized to grow the gate oxide, and even small process changes result in different threshold voltages. Accordingly, it is difficult to control the variable of the gate oxidation process to substantially eliminate auto-doping. Further, making changes in the gate oxidation process causes changes in the threshold voltage.

SUMMARY OF THE INVENTION

It is, therefore, an object of the present invention to provide a method of fabricating metal gate field effect transistors which prevents auto-doping.

Another object of the present invention is to provide a method of fabricating metal gate field effect transistors having a tight distribution of threshold voltages.

A further object of the present invention is to provide a method of fabricating metal gate field effect transistors in which the process utilized to fabricate the gate oxide has a minimal effect on performance characteristics.

These and other objects of the present invention are provided by a method which forms a sealing oxide at the surface of the substrate prior to the formation of the gate oxide. The sealing oxide prevents auto-doping, i.e., the introduction of N-type impurities into the channel regions of the substrate. The sealing oxide is formed by a rapid thermal oxidation process in which the wafer is heated to a high temperature (approximately 1100° C.) in a short time (approximately 15 seconds). The wafer is maintained at this temperature for a short period (less than approximately one minute) in an oxidizing atmosphere. Then, the atmosphere is changed to an inert (nitrogen) atmosphere and the wafer is rapidly cooled (approximately 75° C. per second). The rapid thermal oxidation process forms a thin oxide layer which seals the surface of the substrate in a very short time so that very little phosphorous is introduced to the substrate in the channel region.

A method of fabricating a field effect transistor in a substrate in accordance with the present invention, comprises the steps of (a) providing source and drain regions in the substrate, the drain sources and regions being spaced apart to define a channel therebetween, (b) exposing the surface of the substrate overlying the channel, (c) forming a sealing oxide at the surface of the substrate overlying the channel by rapid thermal oxidation, (d) forming a gate oxide layer overlying the channel after said step (c), and (e) providing a gate terminal overlying the gate oxide layer.

DESCRIPTION OF THE PREFERRED EMBODIMENTS

The method of the present invention will be described with reference to FIGS. 1-6. As described herein, the method of the present invention is utilized to form metal gate CMOS FETs. It is to be understood, however, that the method of the present invention is useful for fabricating other devices, including individual N-channel and P-channel metal gate FETs. Further, although the substrate described herein is an N-type substrate having P-wells formed therein, the method of the present invention is equally applicable to devices formed in a P-type substrate having N-wells. Except as otherwise indicated all implant energies, doses, times, temperatures, and thickness are approximate, and may be altered in accordance with the knowledge of those having ordinary skill in the art.

Figure 1:
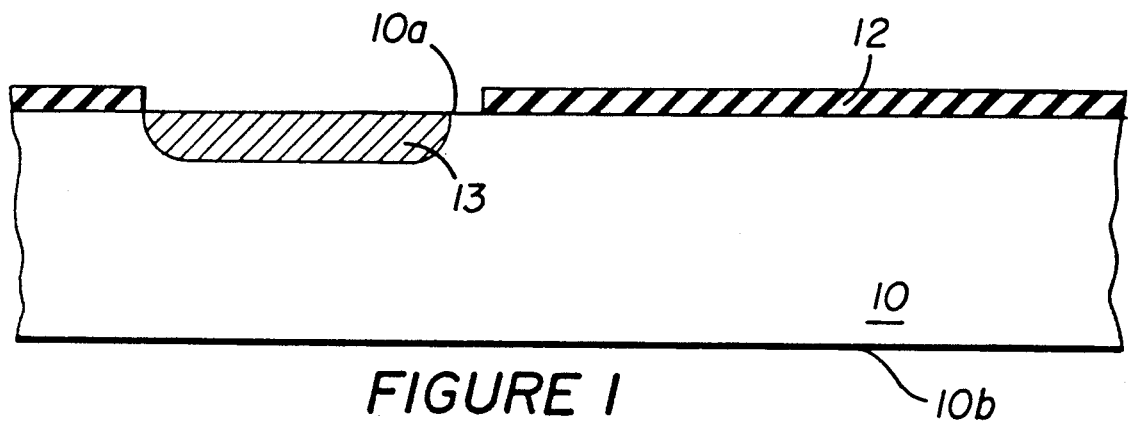
FIGS. 1-6 are sectional views of metal gate CMOS FETs fabricated in accordance with the method of the present invention.

As shown in FIG. 1, a substrate 10, having a first surface 10a and a second surface 10b, has an initial oxide 12 formed on the first surface 10a. Substrate 10 has an N-type background doping concentration of approximately $1 \times 10^{15} cm^{-3}$. In the preferred embodiment, initial oxide 12 has a thickness of 8600Å and is grown using a three step dry, wet, dry oxidation process. Initial oxide 12 may have a thickness ranging from 5,000Å to 15,000Å.

Initial oxide 12 is masked and etched to remove portions of initial oxide 12, thereby exposing the first surface 10a of substrate 10, in regions where P-wells are to be formed. After the initial oxide 12 is removed, boron P-type dopant ions are implanted at an energy of approximately 80 KeV with an implant dose of approximately $1 \times 10^{13} cm^{-2}$. The boron implant 13 is driven at 1000-1250° C. for 9 to 11 hours in an atmosphere comprising nitrogen ($N_2$) and 1-10% oxygen ($O_2$), followed by a wet oxidation at 900-1100° C. for 30 to 90 minutes. The time and temperature of these drive and oxidation processes may be varied to achieve the desired P-well surface concentration and junction depth.

Figure 2:
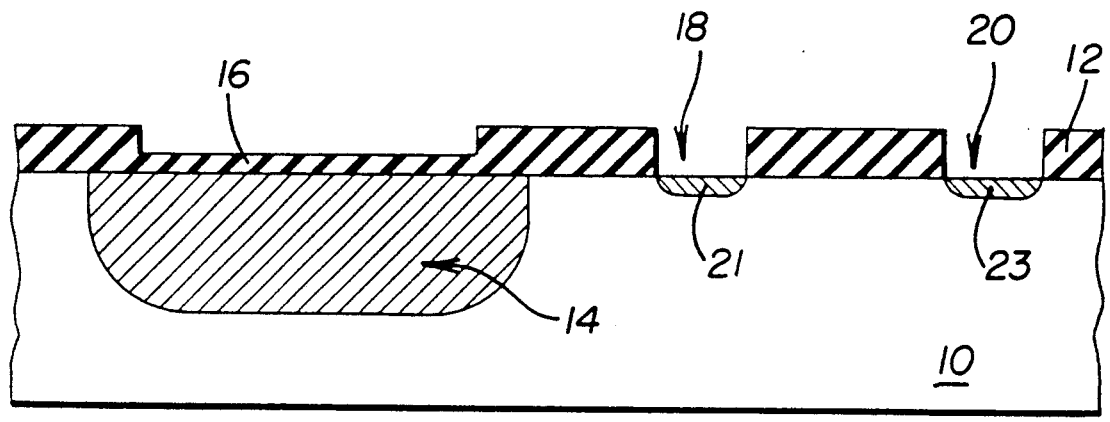

With reference to FIG. 2, driving the P-well implant 13 diffuses the dopant ions, forming P-well 14. In addition, a second oxide layer 16 is grown on the surface 10a of substrate 10 where initial oxide 12 was previously removed. The second oxide layer 16 has thickness of approximately 5,000Å, and the thickness of initial oxide 12 is increased to approximately 10,000Å.

After P-well 14 has been formed, the initial oxide 12 is masked and etched to form openings 18 and 20 corresponding to positions where source and drain regions of a P-channel transistor are to be formed. The coating, exposing and developing of the photo-resist layer (not shown) are performed using standard techniques. The substrate 10 is placed in an atmosphere comprising diborane gas ($B_2H_6$) to introduce P-type dopant ions (i.e., boron ions 21, 23) into the substrate through openings 18 and 20. Another source of Boron is $BBr_3$. The boron ions 21, 23 are driven at a temperature of approximately 900-1100° C. for approximately one to two hours to diffuse the boron ions, thereby forming P-type source and drain regions 22, 24 having a surface concentration of approximately $10^{19} cm^{-3}$.

Figure 3:
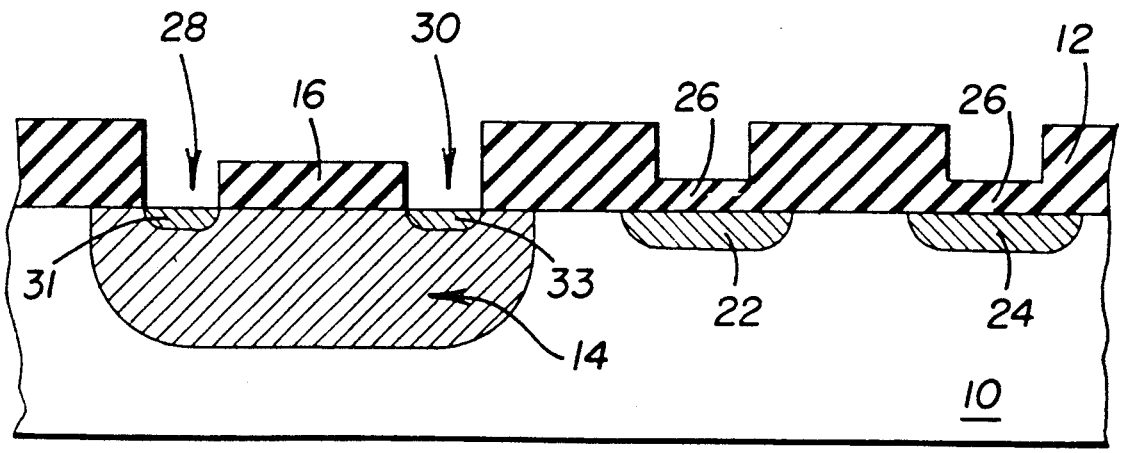
Figure 4:
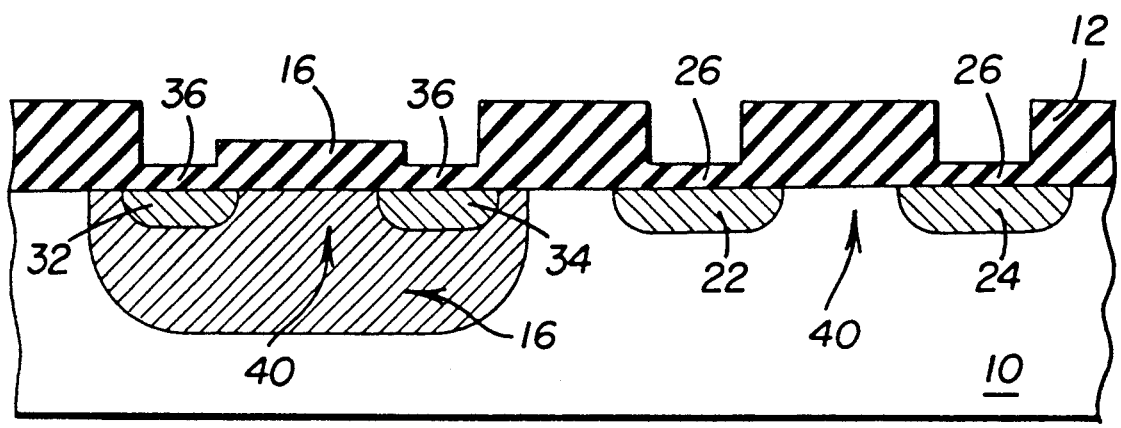

With reference to FIG. 3, third oxide layers 26 having a thickness of 4000Å are formed during drive-in process which forms source and drain regions 22, 24. Additionally, initial oxide 12 is increased in thickness to approximately 1.1 μm. The thickness of second oxide layer 16 is also increased. The time and temperature used to drive the P-type dopant ions may be adjusted to achieve the desired sheet resistance ($\Omega/\square$) and junction depth.

Another masking process provides openings 28 and 30 in second oxide layer 16. This is followed by the introduction of N-type dopant ions 31, 33, typically phosphorus, in an atmosphere comprising phosphine ($PH_3$) or phosphorus oxychloride ($POCl_3$) at a temperature of approximately 850-950° C. for a time sufficient to achieve an surface concentration of approximately $10^{20} cm^{-3}$ in source and drain regions 31, 33. Next, the N-type dopant ions 31, 33 are driven-in at 900-1050° C. for one to two hours. The time and temperature used to drive the N-type dopant ions may be adjusted to achieve the desired sheet resistance ($\Omega/\square$) and junction depth.

Fourth oxide layers 36 having a thickness of 5300Å are formed during the drive-in which forms source and drain regions 32, 34. Further, the thickness of initial oxide 12 is increased to approximately 1.2 μm, and the thicknesses of second oxide layer 16 and third oxide layers 26 are also increased. The time and temperature used to drive the N-type dopant ions may be adjusted to achieve the desired sheet resistance ($\Omega/\square$) and junction depth.

Figure 5:
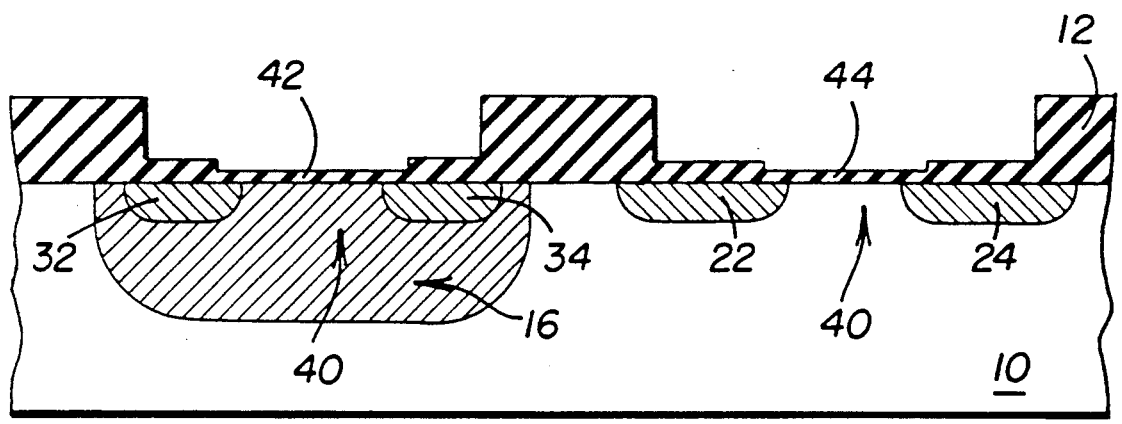
Figure 6:
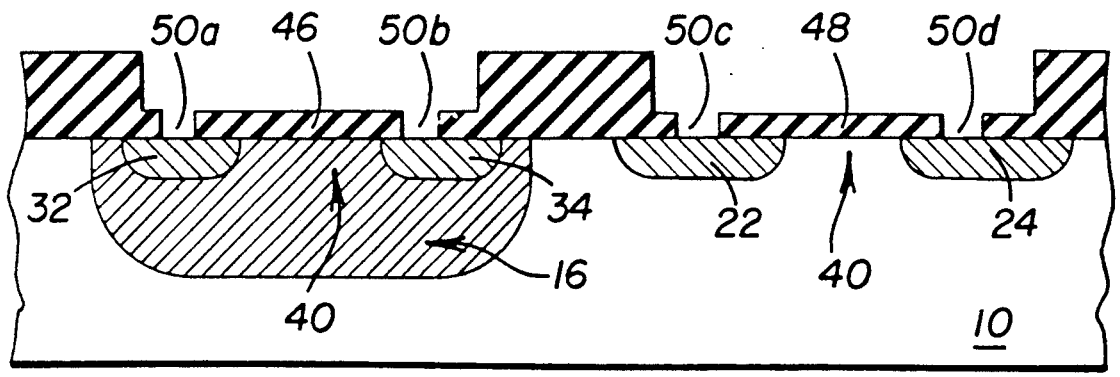

The formation of a sealing oxide 42 and a gate oxide 46 will be described with reference to FIGS. 5 and 6. A masking process removes portions of oxide layers 12, 16, 26, and 36 to expose the surface 10a of substrate 10 in regions where sealing and gate oxide layers 42, 46 are to be formed. The openings overlap source and drain regions 22, 24, 32, and 34, to ensure that the oxide layers to be formed will cover the entirety of channel regions 40.

Sealing oxide 42 is formed by rapid thermal annealing (RTA), also termed rapid thermal oxidation. One type of equipment for performing RTA is the Heat Pulse available from A. G. Associates in Sunnyvale, Calif. The substrate 10 is placed in a chamber containing an oxidizing environment (dry oxygen in the preferred embodiment) and heated to 1150° C. in approximately 15 seconds using quartz halogen lamps. The temperature is maintained at 1150° C. for 30 seconds and 100-150Å of sealing oxide 46 is grown. The oxidation temperature may range from 1050 to 1200° C. and the oxidation time may range from 15 seconds to 1 minute depending on the thickness of the sealing oxide to be grown. Then, the environment in the chamber is changed to a non-oxidizing environment, for example, nitrogen, and the wafer is cooled at a rate of approximately 75° C./second. The fast growth of sealing oxide 42 restricts out-diffusion of N-type dopant ions, and rapidly seals the surface 10a.

It is believed that there are three main sources of the N-type dopant ions which cause auto-doping. First, the presence of chlorine (Cl) in the oxidation chamber causes some phosphorous to leach from the equipment surfaces and enter the atmosphere. (The chlorine may be present because it is used for gettering.) The chlorine also etches the phosphorous-rich silicon from source and drain regions 32, 34 and the second surface 10b of substrate 10, releasing phosphorous into the atmosphere in the chamber. Second, raising the temperature in the oxidation chamber increases the diffusion coefficient for phosphorus and causes out-diffusion of phosphorous from the N-type source and drain regions 22, 34 and surface 10b. Third, phosphorus accumulates on the walls of the quartz tube which forms the oxidation chamber as more and more oxidation cycles are performed and diffuses as the temperature in the chamber is increased. The sealing oxide 42 prevents phosphorous from all of these sources from doping the channel regions of the FETs under fabrication. Any phosphorus in the oxidation environment settles on the sealing oxide and does not diffuse into the channel regions 40 of substrate 10 under the conditions provided by the present invention.

Next, the wafers undergo gate oxidation at approximately 1000° C. in an atmosphere comprising oxygen ($O_2$) and trichloroethane (TCA) to form gate oxide 46. The time of the gate oxidation is reduced by about 5 minutes with respect to conventional gate oxidation cycles, so that the total thickness of the combined sealing and gate oxide layer 46 is about 600Å —— the same thickness provided using conventional gate oxidation processes.

In an alternative embodiment, a gate oxide layer may be grown in a single oxidation process in which the initial place of the oxidation process involves heating the substrate 10 to a least 1000° C. in a period of less than one minute. At present, only RTA equipment is capable of performing this rapid heating. Since, RTA equipment usually processes only a single wafer, it may be less efficient to use the RTA equipment to perform the entire gate oxidation. Nevertheless, as new equipment is developed this alternative embodiment may find greater efficiency because it involves only a single oxidation process.

Contact windows 50a-d are then opened, and a metal layer is deposited over the entire wafer. The metal layer is formed in contact windows 50a-d and makes electrical contact with the source and drain regions 22, 24, 32, 34. Then, the metal layer is masked and etched so that metal gates (not shown) and metal lines (not shown) remain. Finally, passivation layer(s) are formed and the device is packaged.

The benefits of the method of the present invention have been confirmed by experimental results. A first group of FETs were fabricated on eight wafers, including four control wafers fabricated in accordance with conventional techniques and four test wafers. A gate oxide was formed on each wafer. The gate oxide was formed directly on the substrate for the control wafers and on a sealing oxide for the test wafers. For both the control and test wafers, TCA was present in the initial oxidation atmosphere because the presence of TCA is known to increase the likelihood of auto-doping because TCA serves as a source of chlorine. The gate oxide formed on the control wafers was 535Å and the gate oxide formed on the test wafers was 592Å. The threshold voltages for P-channel devices ($V_{TP}$) and N-channel devices ($V_{TN}$) for the FETs on these wafers are shown in Table 1.

TABLE 1

| Control Wafers | | | Test Wafers | | |
|---|---|---|---|---|---|
| Wafer | $V_{TP}$ | $V_{TN}$ | Wafer | $V_{TP}$ | $V_{TP}$ |
| 1 | 1.47 | .32 | 5 | 1.14 | .67 |

TABLE 1-continued

| Control Wafers | | | Test Wafers | | |
|---|---|---|---|---|---|
| Wafer | $V_{TP}$ | $V_{TN}$ | Wafer | $V_{TP}$ | $V_{TP}$ |
| 2 | 1.35 | .37 | 6 | 1.14 | .69 |
| 3 | 1.28 | .43 | 7 | 1.13 | .68 |
| 4 | 1.31 | .43 | 8 | 1.14 | .69 |

A second group of FETs were fabricated on a second group of eight wafers. For the second group of wafers, the initial phase of the gate oxidation process was performed without TCA. Again, the gate oxide was formed directly on the substrate for the control wafers and on a sealing oxide for the test wafers. The gate oxide formed on the control wafers was 544Å and the gate oxide formed on the test wafers was 600Å. The threshold voltages for the FETs on these wafers are shown in Table 2.

TABLE 2

| Control Wafers | | | Test Wafers | | |
|---|---|---|---|---|---|
| Wafer | $V_{TP}$ | $V_{TN}$ | Wafer | $V_{TP}$ | $V_{TN}$ |
| 9 | 1.28 | .54 | 13 | 1.13 | .68 |
| 10 | 1.23 | .52 | 14 | 1.12 | .69 |
| 11 | 1.24 | .51 | 15 | 1.11 | .74 |
| 12 | 1.24 | .50 | 16 | 1.12 | .72 |

The test results show that the devices fabricated using a sealing oxide have more uniform threshold voltages. Further, the threshold voltages for devices having gate oxides formed with different techniques are more closely matched, showing that with the method of the present invention, the particular process utilized to form the gate oxide has a minimal effect on shifts of the threshold voltage.

The many features and advantages of the method of the present invention will be apparent to those skilled in the art from the Description of the Preferred Embodiments. Thus, the following claims are intended to cover all equivalents of the preferred embodiments.

We claim:

1. A method of fabricating a field effect transistor in a substrate, comprising the steps of:
   (a) providing source and drain regions in the substrate, the source and drain regions being spaced apart to define a channel therebetween;
   (b) exposing the surface of the substrate overlying the channel;
   (c) forming a sealing oxide at the surface of the substrate overlying the channel by rapid thermal oxidation;
   (d) forming a gate oxide layer overlying the channel after said step (c); and
   (e) providing a gate overlying the gate oxide layer.

2. A method according to claim 1, wherein said step (c) comprises placing the substrate in an oxidizing environment and heating the substrate to at least 1000° C. in less than one minute.

3. A method according to claim 2, wherein said step (c) comprises placing the substrate in an oxidizing environment and heating the substrate to at least 1100° C. in less than 30 seconds.

4. A method of forming a gate oxide for a metal gate field effect transistor formed in a substrate, comprising the sequential steps of:
   (a) oxidizing the substrate to form a sealing oxide layer having a thickness of approximately 100-150Å by rapid thermal annealing; and (b) forming the gate oxide by oxidizing the substrate to form the gate oxide.

5. A method according to claim 4, wherein said step (a) comprises oxidizing the substrate in an environment comprising oxygen for a time less than two minutes.

6. A method according to claim 4, wherein said step (b) comprises oxidizing the substrate by the sequential sub-steps of:
   (i) placing the substrate in an environment comprising oxygen;
   (ii) raising the temperature of the substrate to greater than 1100° C. in less than 30 seconds;
   (iii) maintaining the temperature of the substrate at greater than 1100° C. for a period sufficient to grow 100-150Å of oxide; and
   (iv) cooling the substrate in an inert environment.

7. A method of preventing auto-doping in the fabrication of metal gate field effect transistors, comprising the steps of:
   (a) providing source and drain regions in a substrate, the source and drain regions being spaced apart to define a channel therebetween;
   (b) exposing the surface of the substrate corresponding to the position of the channel;
   (c) sealing the surface of the substrate exposed in said step (b) by rapid thermal oxidation, comprising the substeps of:
       (1) placing the substrate in an oxidizing environment and raising the temperature of the substrate to greater than 1100 C in less than 20 seconds,
       (2) changing the environment to an inert environment and reducing the temperature of the substrate at a rate of greater than $-60°$ C. per second;
   (d) oxidizing the substrate to form a gate oxide after said step (c); and
   (e) providing a gate overlying the gate oxide and the channel.

8. A process of fabricating a complementary metal-oxide-silicon (CMOS) field effect transistor (FET) in a substrate having N-type conductivity, comprising the steps of:
   (a) providing a first oxide layer on the surface of the substrate;
   (b) removing a selected portion of the first oxide layer corresponding to a region where a P-well is to be formed;
   (c) implanting a P-type dopant in the substrate in the region where the first oxide layer has been removed to form a P-well;
   (d) annealing the FET to drive the dopant implanted in said step (c) and to grow a second oxide layer in the regions where the first oxide layer was removed in said step (b);
   (e) forming P-type source and drain regions in the substrate, the P-type source and drain regions being spread apart to define a channel therebetween;
   (f) forming N-type source and drain regions in the P-well, the N-type source and drain being spaced apart to define a second channel therebetween;
   (g) exposing portions of the surface of the substrate overlying the first and second channels;
   (h) rapid thermally annealing the FET for less than two minutes to form a sealing oxide;
   (i) oxidizing the substrate to form a gate oxide after said step (h); and
   (j) forming first and second gates overlying the gate oxide and respective areas of the first and second channels.

* * * * *

UNITED STATES PATENT AND TRADEMARK OFFICE
CERTIFICATE OF CORRECTION

PATENT NO. : 5,024,962

DATED : June 18, 1991

INVENTOR(S) : Murray, et al.

It is certified that error appears in the above-identified patent and that said Letters Patent is hereby corrected as shown below:

Column 8, line 21, change "P-type" to --$P^+$-type--.
Column 8, line 22, change "P-type" to --$P^+$-type--.
Column 8, line 25, change "N-type" to --$N^+$-type--.
Column 8, line 26, change "N-type" to --$N^+$-type--.

Signed and Sealed this

Sixth Day of October, 1992

Attest:

DOUGLAS B. COMER

*Attesting Officer*  Acting Commissioner of Patents and Trademarks